(12) United States Patent
Teverovsky et al.

(10) Patent No.: US 6,231,923 B1
(45) Date of Patent: May 15, 2001

(54) CHEMICAL VAPOR DEPOSITION OF NEAR NET SHAPE MONOLITHIC CERAMIC PARTS

(75) Inventors: Alexander Teverovsky, Concord; James C. MacDonald, Reading; Lee Erich Burns, Winchester, all of MA (US)

(73) Assignee: Tevtech LLC, Wilmington, MA (US)

( * ) Notice: Subject to any disclaimer, the term of this patent is extended or adjusted under 35 U.S.C. 154(b) by 0 days.

(21) Appl. No.: 09/375,734

(22) Filed: Aug. 17, 1999

Related U.S. Application Data

(60) Provisional application No. 60/096,732, filed on Aug. 17, 1998.

(51) Int. Cl.[7] .................................................. C23C 16/44
(52) U.S. Cl. .................. 427/248.1; 427/251; 427/255.5; 118/730
(58) Field of Search ................................ 427/248.1, 251, 427/255.5; 118/730

(56) References Cited

U.S. PATENT DOCUMENTS

| | | |
|---|---|---|
| 4,062,318 * | 12/1977 | Ban et al. . |
| 4,241,698 * | 12/1980 | Vitale . |
| 4,923,716 | 5/1990 | Brown et al. . |
| 4,997,678 | 3/1991 | Taylor et al. . |
| 5,071,596 | 12/1991 | Goela et al. . |
| 5,154,862 | 10/1992 | Reagan et al. . |
| 5,354,580 | 10/1994 | Goela et al. . |
| 5,374,412 | 12/1994 | Pickering et al. . |
| 5,465,184 | 11/1995 | Pickering et al. . |
| 5,474,613 | 12/1995 | Pickering et al. . |
| 5,849,359 * | 12/1998 | Burns et al. . |

* cited by examiner

*Primary Examiner*—Timothy Meeks
(74) *Attorney, Agent, or Firm*—Vernon C. Maine; Scott J. Asmus

(57) ABSTRACT

A method and apparatus for producing a coating or a near net shaped monolithic ceramic part by chemical vapor deposition, where the resultant coatings or parts consume less deposit material and require less machining. Mandrel substrates are closely designed for producing a specific, near net shaped final part, including negative relief features. Several of the mandrel substrates are mounted through centers in a spaced relationship on one or more rotable shafts as tooling for a chemical vapor deposition furnace. The tooling is installed in a chemical vapor deposition furnace so that the shafts are oriented perpendicular and the substrate planar surfaces are parallel to the flow pattern of reactant gases through the furnace. The shafts are rotated during the deposition process so that the mandrel substrates each receive a uniformly distributed ceramic deposit in the near net shape of the final part.

12 Claims, 8 Drawing Sheets

CHEMICAL VAPOR DEPOSITION OF NEAR NET SHAPE MONOLITHIC CERAMIC PARTS

This application claims priority to pending U.S. application Ser. No. 60/096,732, filed Aug. 17, 1998, by the same applicants.

BACKGROUND OF THE INVENTION

1. Technical Field of the Invention

This invention relates to means for producing monolithic ceramic parts during the chemical vapor deposition (CVD) process in a shape more closing approximating the desired final shape of a discreet part, and more particularly to the use of multiple mandrel substrates mounted on rotating shafts in a CVD furnace.

2. Background

The current technology of producing monolithic ceramic parts via the chemical vapor deposition (CVD) process consists of producing large sheets of the ceramic material in the CVD furnace, from which the final ceramic part or parts are then machined. The machining process includes cutting the rough shape out of a large sheet, grinding the piece to near thickness to produce a "blank" approximating the final form but with surplus material thickness on each face, and then machining the blank to the dimensions of the final form.

When CVD materials are deposited on large flat substrates, the material thickness profile is typically non-uniform. The CVD process time must be increased to bring the low deposition rate areas up to the minimum thickness requirements for the desired parts. The higher deposition rate areas then cause the pieces cut from the sheet to require more machining time in order to be ground to the required thickness.

There is limited flexibility in the geometry of a sheet and the pieces to be cut, so there is material waste due to the layout pattern of parts. There is also surplus material in the piece pattern that is cut or ground from between and within the pieces to make the blanks, such as edges and centers of rings, which is scrapped. Multiple depositions are required for some forms and shapes.

There are also occasional problems with cracking of a large, CVD-produced plate or sheet of ceramic material during the CVD process, which can reduce the yield significantly. The combination of cracks, the scrap material from the sheet and the material that is ground off the blanks lowers the average raw material-to-product conversion ratio significantly.

SUMMARY OF THE INVENTION

The invention, stated in the simplest terms, is a method and apparatus for producing near net shaped monolithic ceramic parts by chemical vapor deposition, where the resultant parts consume less deposit material and require less machining than previous methods and set ups. Double sided mandrel substrates are closely designed for producing a specific, near net shaped final part, ring parts being especially suitable for production by this methodology. Disks, rings, spheres, and cylindrical parts are produced using a rolling point of contact during the deposition that enables the entire surface area of the substrate to be coated in one cycle.

Several of the ring or disk shaped substrates are loosely suspended through their centers in individual, spaced grooves on one or more rotable shafts. The shafts are incorporated into the setup tooling for installation in the chemical vapor deposition furnace. The tooling is installed and configured so that the majority surface areas of the substrates are oriented parallel to the flow pattern of reactant gases. The shafts are rotated so that the mandrel substrates roll freely over the rolling shafts within the vapor flow so as to receive a uniformly distributed ceramic deposit in the near net shape of the final part.

The oversize center of the substrate creates the ability to have only a line or two point contact between the substrates and the support shaft. this line is moving along the substrates and therefore gives the ability to deposit on the full surface area, including the inside diameter, of the substrates without leaving "support marks" or uncovered areas. This allows deposition of parts ready for final machining, in one deposition cycle.

The apparatus used in the process of the invention is a furnace system, configured to produce CVD ceramic materials in the manner of the prior art, but with modified internal deposition tooling and with modified process conditions.

The CVD furnace system consists of a water cooled furnace chamber and covers, a vacuum pumping system in the cases where the process is conducted at lower than ambient pressure, a process gas preparation and distribution system, a heating element, power supply, thermal insulation, process controller, and an effluent scrubbing system.

The internal tooling consists of a square or rectangular enclosure, a rotation shaft or shafts that are supported by and passing through two walls of the enclosure, multiple mandrel substrates supported along the shaft, gear system, a rotary seal feed through port, and a mechanical rotation system for driving the shaft and gear system.

The shaft or shafts are configured with spaced apart grooves that may be square, radius, or v-groove in cross section, depending on the geometry of the edge or inner diameter of the mandrel substrate. The groove keeps the substrate in position on the shaft and adequately spaced from adjacent substrates. The shape and depth of the groove is sufficient to accommodate a fully deposited substrate.

The substrates are machined to size and include the negative shape of the features of the final part. The substrates rotate with the shaft.

The enclosure, shafts, substrates, and gear system are commonly fabricated or incorporate graphite, although other materials can be used. Substrates of substantially different sizes, in respect to outside diameter and inside diameter and detail, can be combined in the same batch, increasing the flexibility of the batch.

The function of the apparatus used to practice the invention is as follows. The design of the substrate tooling provides a total deposition surface area for the batch being processed, that is considerably greater than the deposition area of the current technology. By using multiple shafts loaded with substrates, more product sites can be utilized per deposition cycle. A similar amount of reactant materials will produce more usable solid material in the near net shape form.

Also, the rotating shafts and orientation of the substrates parallel to the reactant gas flow, promotes a more uniform rate of deposit over all surface areas, and therefore decreases the CVD process cycle time. The combination of a near net shape part and the uniform deposit thickness also decreases the machining operations needed to achieve a final part. By providing near net shape parts and eliminating some machining operations, the product yield is increased, and the total time and cost is decreased.

The method of the invention is as follows. The furnace is loaded with the internal tooling set up, sealed, evacuated, inerted, and is heated up to the deposition temperature. The reactant gases are injected into the heated deposition isolation box. The process controller controls the temperature, pressure, and reactant gas flows inside the furnace. As the mandrel substrates are rotating on the shaft, the reactant gases flow in parallel to the mandrel substrates, and deposit solid ceramic material on the entire exposed surfaces.

When the deposition is complete, the system is flushed, cooled, and unloaded. The mandrel substrates are removed from the shaft. The solid ceramic material is then separated from the substrate, depending on the application. The near net shape part is then machined to produce the final part.

Still other objects and advantages of the present invention will become readily apparent to those skilled in this art from the following detailed description, wherein we have shown and described only a preferred embodiment of the invention, simply by way of illustration of the best mode contemplated by us in carrying out our invention.

DESCRIPTION OF THE PREFERRED EMBODIMENT

Figure 1:
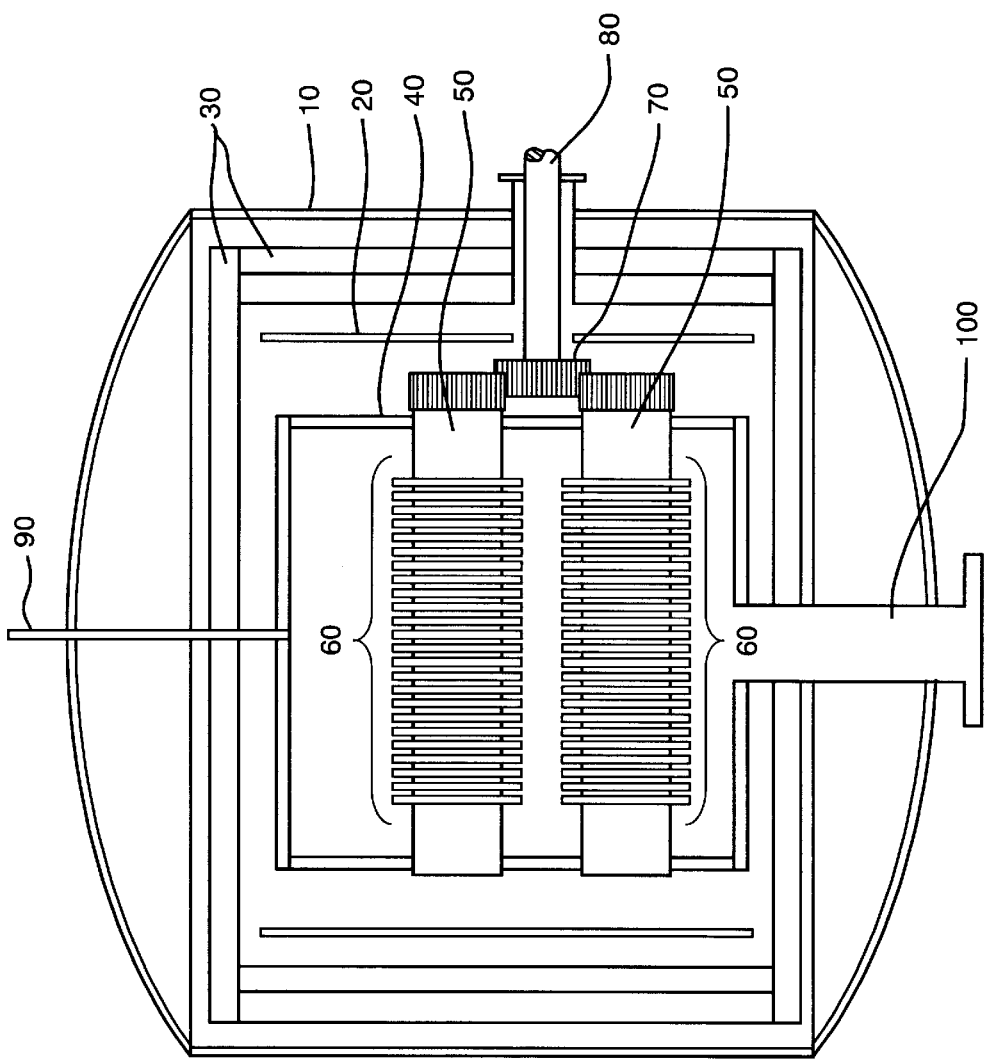
FIG. 1 is a cross section side view of the internal deposition tooling and furnace chamber of the apparatus used in the practice of the invention.
Figure 2:
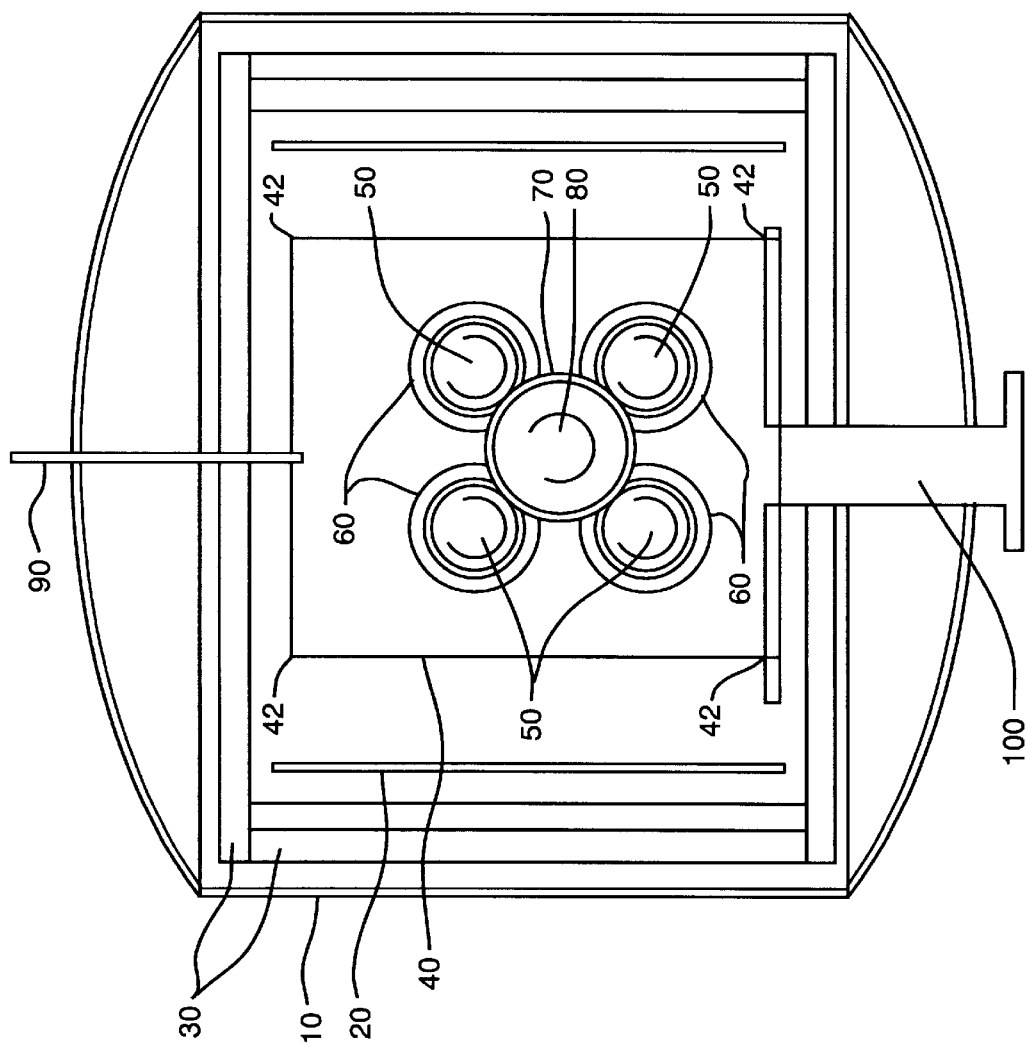
FIG. 2 is a cross section end view of the tooling and chamber of FIG. 1.
Figure 4:
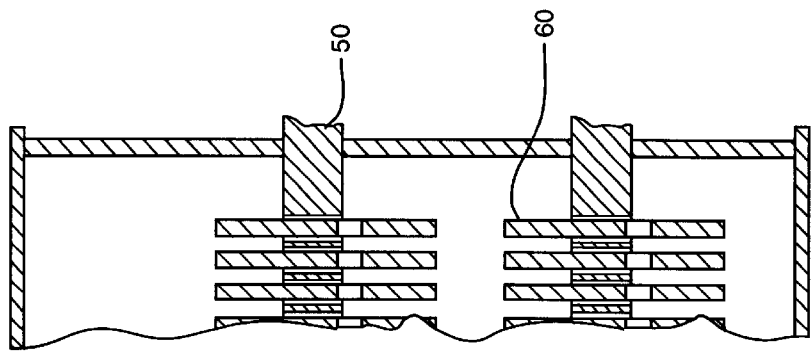
FIG. 4 is a partial section view of two of the shafts and enclosure of FIG. 3, on which uniformly spaced mandrels are mounted.
Figure 3:
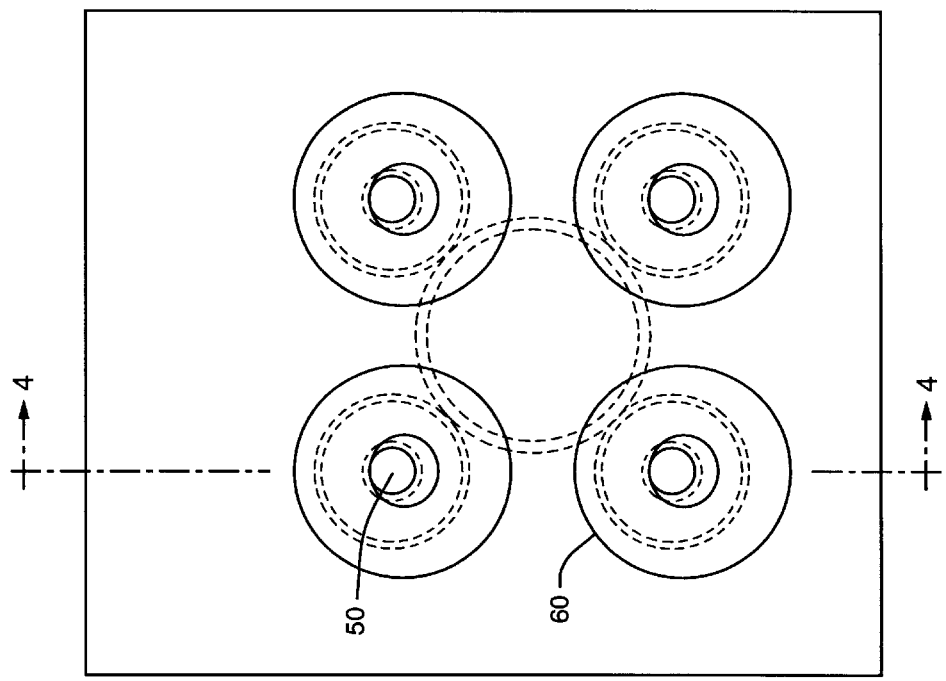
FIG. 3 is a diagrammatic end view of four ring mandrel substrates suspended within the enclosure of the tooling of FIG. 1, with a dotted line end view depiction of the rotating support shafts and gear train.
Figure 6:
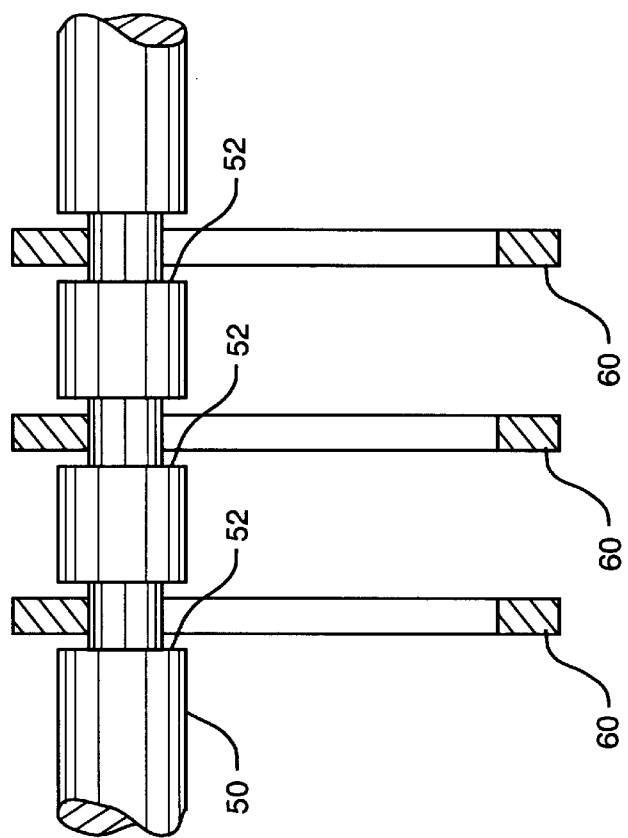
FIG. 6 is a partial side view of the shaft of FIG. 5, with cross section views of three large inner diameter mandrel substrates hanging in respective grooves.
Figure 5:
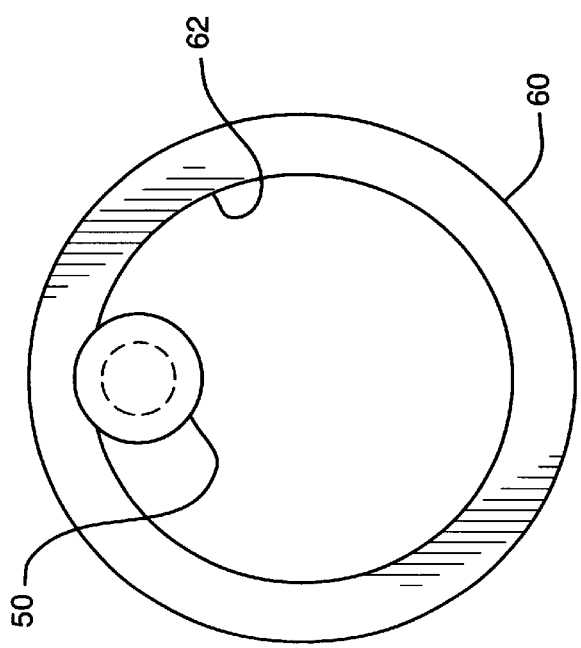
FIG. 5 is a diagramatic end view of a ring style mandrel substrate with a large inner diameter, suspended in the groove of a rotation shaft.

The apparatus used in the process of the invention is a furnace system, configured to produce chemical vapor deposition (CVD) ceramic materials in the manner of the prior art, but with modified internal deposition tooling and with modified process conditions.

Referring to FIGS. 1 through 6, a CVD furnace system consists of a water cooled furnace chamber 10 and associated covers, a vacuum pumping system (not shown), a process gas preparation and distribution system (not shown), a heating element 20, power supply (not shown), thermal insulation 30, process controller (not shown), and an effluent scrubbing system (not shown).

The internal tooling relating to the invention consists of a square or rectangular graphite enclosure 40, graphite rotation shafts 50, that are supported by and passing through two walls of enclosure 40, double-sided graphite mandrel substrates 60 attached in a non-rotational manner and supported by graphite shafts 50, graphite gear system 70, a rotation feed through port 80, and a mechanical rotation system (not shown).

Referring to FIGS. 3–6, shafts 50 are configured with a series of spaced grooves 52, which may be square, round or v-grooved. The inner surface 62 of ring type mandrel substrates 60 rides in groove 52, with either a line or a two point rolling contact as the shaft turns.

The edges 42 of enclosure 40 that are parallel to the graphite rotation shafts 50 are shown square but may have a large radius somewhat greater than the maximum size of the fully deposited mandrel substrates to promote uniform distribution and flow of gases.

Reactant gas is admitted at injector 90 at the top of chamber 10. Effluent exhaust port 100, at the base of chamber 10, connects to the vacuum pump and scrubber systems. The general direction of flow is vertical.

The graphite mandrel substrates 60 have been machined to size prior to installation on graphite shafts 50, including the negative shape of the features of the final part. Their surface areas are predominantly on the two flat sides or planar sections as opposed to the area on the edges and in the center. Substrates 60 rotate on their line or points of support on their respective graphite shafts 50 during the CVD process. Graphite shafts 50 are configured horizontal, perpendicular to the vertical flow of reactant gas, so that the flat planes of rotating mandrel substrates 60 are parallel with the reactant gas flow during CVD.

According to the preferred method of the invention, mandrel substrates 60 are substantially disk-like in form, sized and produced as CVD sites for their respective parts. The mandrel substrates are mounted on the graphite shafts 50 through their centers in a loose fitting manner, with their planar surfaces perpendicular to the axis of rotation of their respective shaft, and hence parallel to the gas flow through furnace chamber 10. Mandrel substrates 60 are preferably geometrically round and true, but target area shape, size, area distribution and center of gravity considerations before and after the deposition process, may require variations in shape or offsets in the mounting center.

The grooves 52 are oriented with sufficient spacing on shafts 50 to avoid interruptions to uniform gas flow patterns during the rotation of the substrates, and to avoid the likelihood of adjacent deposits attaching and interconnecting their respective substrates during the CVD cycle. The shafts, if more than one, are likewise oriented and spaced to minimize the probability of interrelated contact or flow disturbances.

Furnace chamber 10 is loaded with the internal tooling set up described above, sealed, evacuated if desired, inerted, and heated up to the deposition temperature. The reactant gases are applied at injector 90 into the heated graphite deposition isolation box 40. The process controller controls the temperature, pressure, and reactant gas flows inside furnace chamber 10. Mandrel substrates 60 are rotated by rotating the assembly graphite gear system 70 at a minimum speed sufficient to insure at least several rotations of mandrel substrates 60 during the CVD cycle period. This is helpful to promote uniform deposit levels on all surfaces and to mitigate any variations in thickness due to variations in rate of flow or deposit during the cycle. Maximum speed is limited by the physics of the rotation and deposition process; including weight and balance, coefficient of friction between ceramic coating and rotating shaft, and inertial and centrifugal force considerations of the fully loaded mandrels on the shafts.

The reactant gases flow in parallel to the plane of the rotating mandrel substrates, and deposit solid ceramic material on the exposed surfaces. The cycle is timed for achieving deposit levels up to the minimum thickness necessary for final machining of the part. The result is a multiplicity of near net shaped parts ready for final machining.

Figure 7:
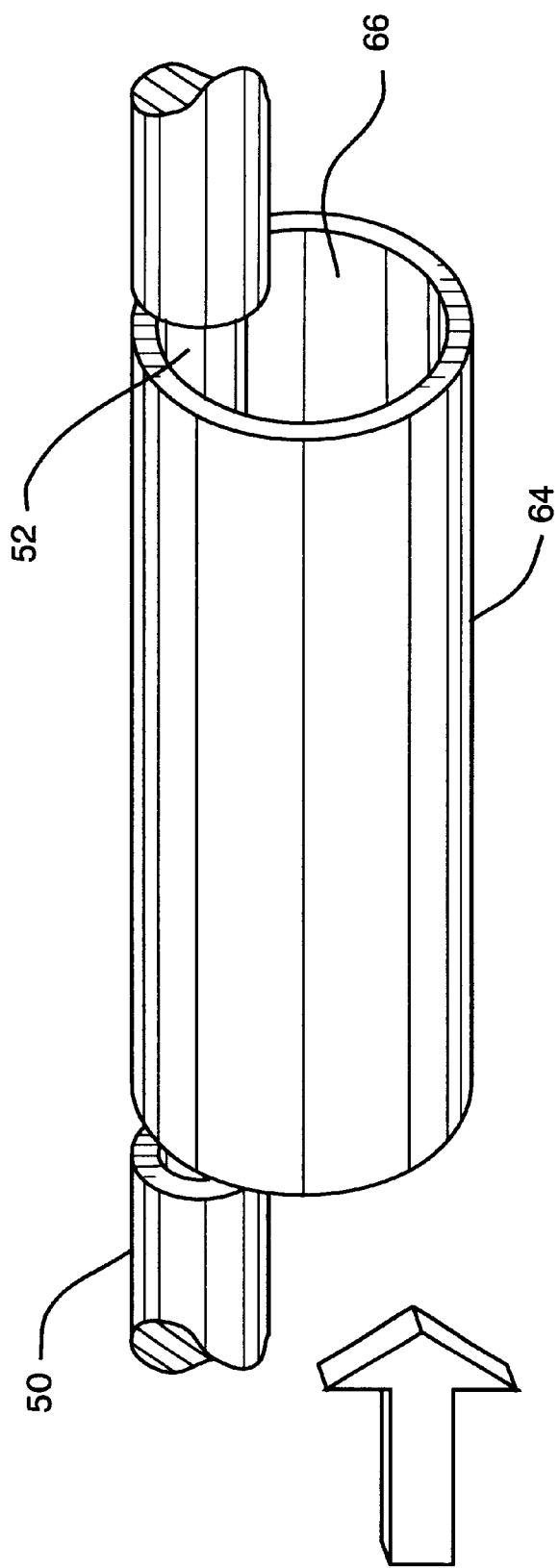
FIG. 7 is a partial perspective view of an open ended cylinder substrate mounted through its center on a rotating shaft according to the invention, with the flow of chemical vapor directed lengthwise of the cylinder.

It will be readily apparent that the majority of the surface area of a predominately cylindrical structure is normal to the surface area of a disk shaped mandrel. Referring to FIG. 7, an alternate embodiment of the invention provides that open ended cylindrical substrate 64 is supported through its center on rotating shaft 50 in groove 52, such that rotating inner surface 62 is in rolling line contact with shaft 50. This setup of tooling and substrate is configured and oriented within a furnace chamber to have a horizontal direction of flow that is lenthwise to the cylinder and therefore parallel to the major surface areas of the substrate. It will be apparent that the number of cylinders that can be accomodated on one shaft is dependent primarily on the relative lengths of the shaft and the cylinders.

Figure 8:
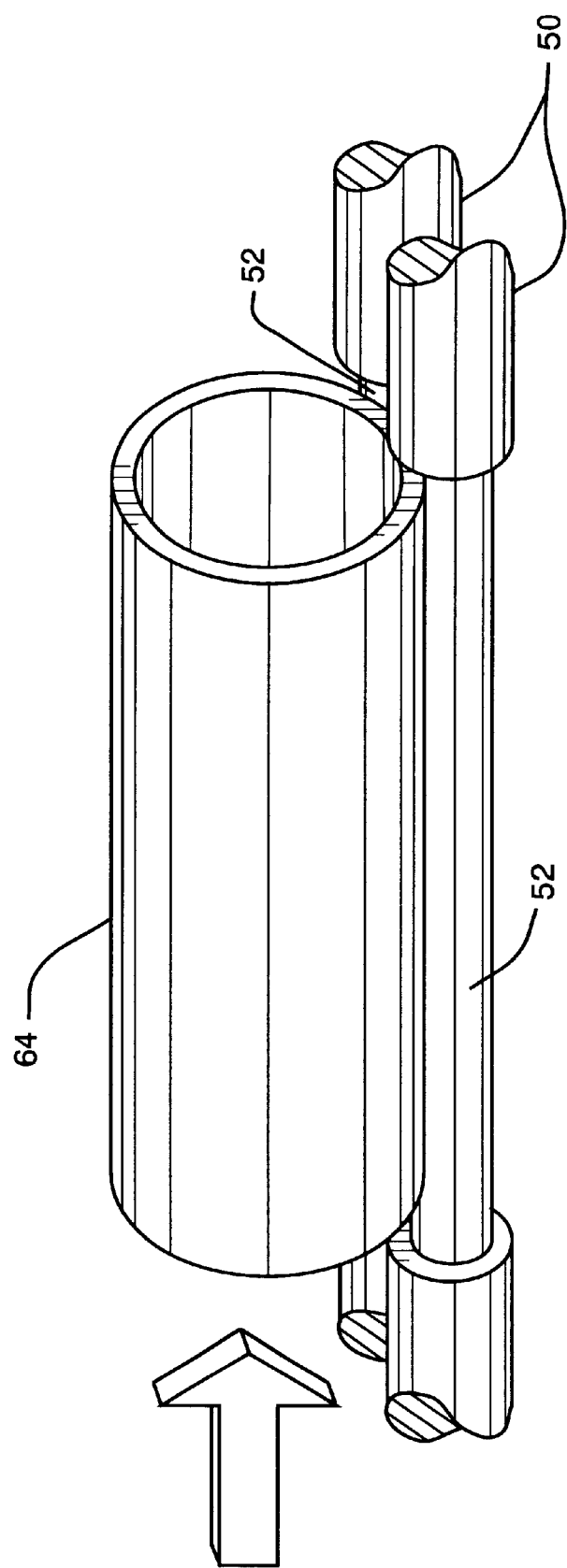
FIG. 8 is a partial perspective view of an open ended cylinder substrate mounted on two rotating cylinders, with the flow of chemical vapor directed lengthwise of the cylinder.

Referring to FIG. 8, an alternate embodiment of the invention provides two parallel rotating shafts 50, with grooves 52 within which is supported on two rolling lines of contact cylinder substrate 64. As above, one pair of parallel shafts can support more than one cylinder, depending mainly on relative lengths.

Figure 9:
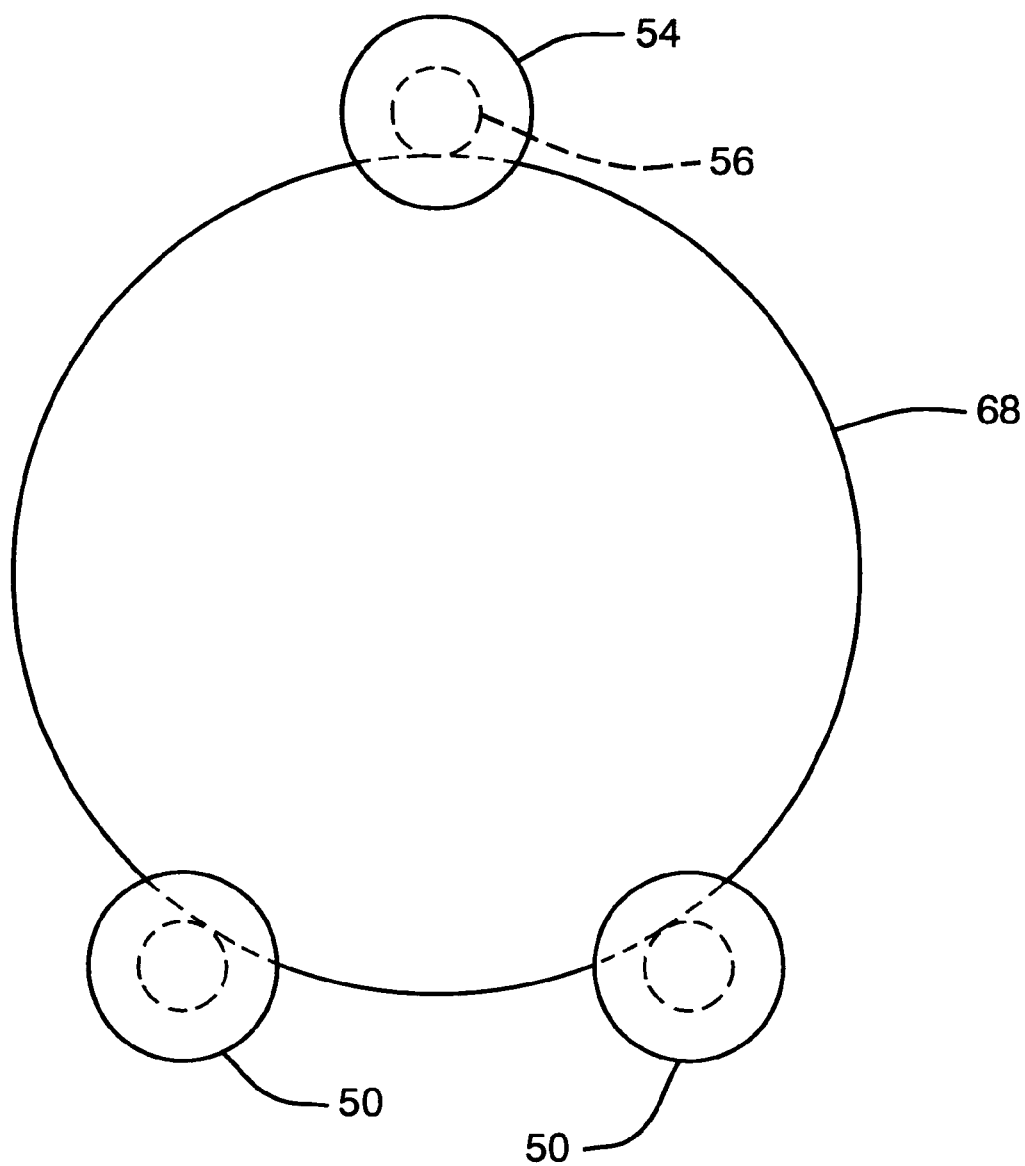
FIG. 9 is an end view of a disk substrate mounted in the grooves of two supporting rotating shafts and held at the top within the groove of a guide shaft.

Referring to FIG. 9, analogous to the two roller support of cylinder substrate 64, disk substrate 66 is supported in the grooves 52 of two parallel rotating shafts 50, and is provided lateral support by groove 56 of parallel guide shaft 54. As in the preferred embodiment, the grooves and disk substrates are arranged with uniform spacing with flat surfaces parallel to the direction of flow in the tooling enclosure or furnace chamber.

Figure 10:
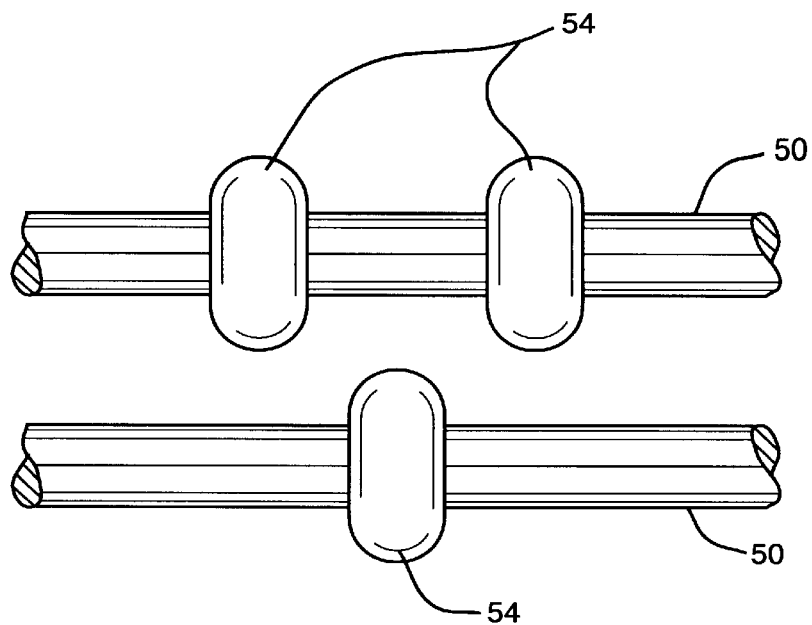
FIG. 10 is a partial top view of a horizontal, rotating parallel two shaft, three knob support base for a free rolling round substrate.

Referring to FIG. 10, a spherical substrate (not shown) is supported with rolling three point contact on three support knobs 54 configured on two parallel rotating shafts 50. The same two parallel support shafts can accommodate additional sets of knobs and spherical substrates. It will be apparent that the center point roller tends to track an endless loop about the center of the substrate as it grows by deposition, while the two outer points follow an endless inward spiral on the ceramic surface. The center track loop has not been determined to be detrimental, however it can be avoided with another embodiment.

Figure 11:
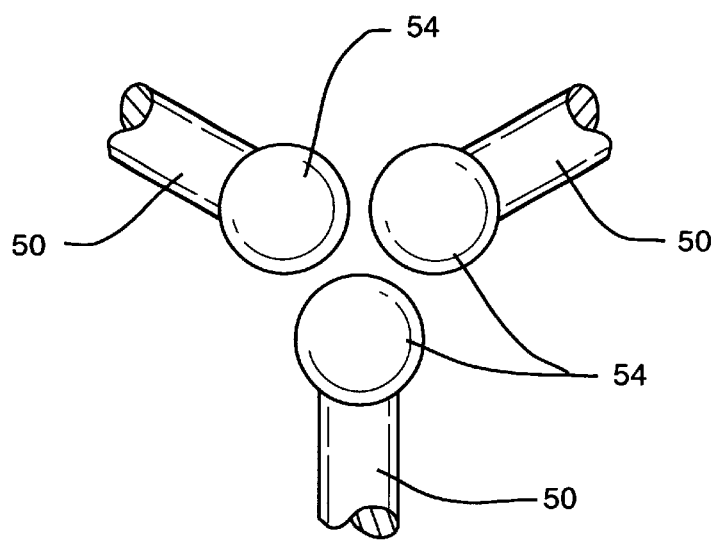
FIG. 11 is a partial top view of a horizontal, rotating radially oriented three shaft, three knob support base for a free rolling round substrate.

Referring to FIG. 11, a spherical substrate (not shown) is supported with rolling three point contact on three support knobs 54, terminating three radially oriented rotating shafts 50. It will be apparent the three contact points each tend to track an endless inward spiral as the spherical substrate grows with deposition; however, the support structure gear train for the shafts is somewhat more complex.

In all cases, it will be apparent that the term "groove" embraces any circumfrential structure attached to or inscribed in the shaft capable of providing resistance to lateral drifting of the substrate as it rolls along on its rolling point of tangential support. Likewise, reference to a tangential rolling point of support can be interpreted to be a rolling line of support in the case of a flat bottom groove and cylinder or disk with flat wall inner surface, or a rolling pair of points of contact as in the case of a V-groove and curved inner wall of the substrate. A reference or claim that a "center", the hole in the disk substrate or inner diameter of a cylinder, is larger than the shaft, means that the center of the substrate is large enough to fit over whatever structure is present on the shaft to get to and be installed in its groove.

The invention is susceptible of many variations. Accordingly, the drawings and following description of the preferred embodiment are to be regarded as illustrative in nature, and not as restrictive. For example, substrates of substantially different sizes, in respect to outside diameter and inside diameter and detail, can be combined in the same batch, increasing the flexibility of the batch.

As a further example, the general design of the disk and ring type substrate tooling configuration provides a total deposition surface area that is approximately equal to or greater than the deposition area of the prior art. A similar amount of reactant materials produces more usable solid material in the near net shape form. While using a single shaft is within the scope of the invention, by using multiple shafts configured perpendicular to the flow, each loaded with individual substrates, more product sites can be utilized per deposition cycle. Further, while the shafts in the preferred embodiment are parallel to each other, alternate configurations of tooling may place the shafts in non-parallel relationships, but still perpendicular to the reactant gas flow.

As a still yet further example, there is a method for producing near net shaped monolithic ceramic parts by deposition of chemical vapor consisting of the steps of loosely mounting a multiplicity of disk-like mandrel substrates through their respective centers in a spaced and parallel relationship in grooves on a shaft with the planar surfaces of the mandrel substrates oriented perpendicular to the axis of said shaft, installing the shaft within a chemical vapor deposition furnace perpendicular to the direction of flow of the chemical vapor through the furnace during a chemical vapor deposition cycle, conducting a chemical vapor deposition cycle, rotating the shaft during the deposition cycle, removing the mandrel substrates from the shaft after said deposition cycle, and, if required, separating the near-net size ceramic parts from their respective mandrel substrates. Of course, the substrates can in the alternate be non-rotatingly attached to the shafts, if deposition on the mounting surfaces is not required.

As yet still a further example, there is a plurality of shafts, where the disk-like mandrel substrates are distributed among the shafts. In another variation, the shafts are arranged to be in parallel. In another example, the shafts are installed in the furnace by use of an enclosure which is adaptable for installing in the furnace and further adaptable for flowing the chemical vapor in a pre-determined direction of flow through the enclosure during the deposition, where the shafts are configured within the enclosure perpendicular to the direction of flow through the enclosure.

In yet another example of the invention, there is a method for producing near net shaped monolithic ceramic parts that includes rotating the mandrel substrates in the flow of chemical vapors at least five rotations over the deposition cycle. As a variation, there is sequential rotating and counter rotating of the shafts. This variation can, for example, accommodate odd shaped mandrels for which there may not be clearance within the furnace or enclosure for full rotation.

Methods of the invention using multiple mounting shafts include systems using a common drive system for all shafts.

In still yet another example of the invention, there is tooling for producing near net shaped monolithic ceramic parts by deposition of chemical vapor within a furnace, consisting of at least one shaft with means for mounting several mandrel substrates by their centers at spaced intervals in a parallel relationship with their major planar surfaces perpendicular to the axis of the shaft, means for mounting the shaft within the furnace perpendicular to the direction of flow of the chemical vapor through the furnace, and means for rotating the shaft during said deposition.

In variations, the tooling includes four shafts oriented in parallel, and the means for rotating consists of a common drive system connected to each said shaft. Other variations include an enclosure adaptable for installing in the furnace and further adaptable for flowing the chemical vapor in a pre-determined direction of flow through the enclosure during deposition, and means for mounting the shaft or shafts within the enclosure perpendicular to the direction of flow through the enclosure. Variations include those where the edges of the enclosure perpendicular to the direction of flow are configured with a radius not smaller than that of the mandrel substrates being used, so as to promote a uniform flow through the enclosure and around the mandrel substrates.

As an additional example, there is a chemical vapor deposition furnace system for producing near net shaped monolithic ceramic parts, consisting of a water cooled furnace chamber and associated covers, a vacuum pumping system, a process gas preparation and distribution system, a heating element, a power supply, thermal insulation, a process controller, an effluent scrubbing system, and tooling, where the tooling consists of any of the examples and variations described above.

There is moreover, within the scope of the invention, a method for producing monolithic disk shaped ceramic parts by deposition of chemical vapor consisting of the steps of: utilizing tooling including at least one shaft and at least one disk-like substrate with its center larger than the diameter of the shaft, the shaft having at least one circumfrential groove; loosely mounting through its center each substrate in a respective groove on the shaft so as to provide a tangential point of support within the groove when the shaft is held horizontal; installing the shaft horizontally within a chemical vapor deposition furnace configured for a vertical direction of flow of chemical vapor; conducting a chemical vapor deposition cycle; rotating the shaft during the deposition cycle so as to cause a rolling point of support of each substrate; and removing the substrate from the shaft after the deposition cycle.

There is a related method for producing monolithic disk shaped ceramic parts as in the paragraph above, where the substrate is a multiplicity of substrates, and the groove is a multiplicity of spaced apart grooves. There is another method for producing monolithic disk shaped ceramic parts as in the paragraph above, where the shaft is a plurality of shafts, and the substrates are distributed among the shafts. There is also a method for producing monolithic disk shaped ceramic parts as in the paragraph above, the shafts being oriented in parallel when installed in the furnace chamber.

There is yet another method for producing monolithic disk shaped ceramic parts as in the same paragraph above, where installing the shaft further includes installing it within an enclosure, where the enclosure is adaptable for installing in the furnace and further adaptable for flowing the chemical vapor in a pre-determined direction of flow through the enclosure during deposition.

There is still another method for producing monolithic cylinder shaped ceramic parts by deposition of chemical vapor consisting of the steps of: utilizing tooling including at least one shaft and at least one cylindrical substrate with its inner diameter larger than the diameter of the shaft, where the shaft has at least one circumfrential groove; loosely mounting through its inner diameter each cylindrical substrate in a respective groove on the shaft so as to provide a tangential point of support within the groove when the shaft is held horizontal; installing the shaft horizontally within a chemical vapor deposition furnace configured for a vertical direction of flow of chemical vapor; conducting a chemical vapor deposition cycle; rotating the shaft during the deposition cycle so as to cause a rolling point of support of each substrate; and removing the substrate from the shaft after the deposition cycle.

There is another related method for producing monolithic cylinder shaped ceramic parts as in the preceeding paragraph, where the substrate is a multiplicity of substrates, and the groove is a multiplicity of spaced apart grooves. There is yet another method for producing monolithic cylinder shaped ceramic parts as in the preceeding paragraph above, where the shaft is a plurality of shafts, and where the substrates are distributed among the shafts.

There is still yet another method for producing monolithic cylinder shaped ceramic parts as in the same preceeding paragraph above, where the installing of the shaft includes installing it within an enclosure, the enclosure being adaptable for installing in the furnace and further adaptable for flowing chemical vapor in a pre-determined direction of flow through the enclosure during deposition.

There is an additional method for producing monolithic disk shaped ceramic parts by deposition of chemical vapor consisting of the steps of: utilizing tooling including at least three rotable shafts and at least one disk-like mandrel substrate, each shaft having at least one circumfrential groove; supporting the three shafts in a parallel, non planar relationship with their grooves aligned; loosely mounting the disk-like mandrel substrate between the shafts within within the grooves on each shaft so as to provide a tangential point of support within the groove on at least two of three shafts, and loose lateral support within all the grooves; installing the three shafts within a chemical vapor deposition furnace configured for a direction of flow of chemical vapor parallel to the flats of the substrate; conducting a chemical vapor deposition cycle; rotating the shafts during the deposition cycle so as to cause rolling of the points of support of the substrate; and removing the substrate from the shafts after the deposition cycle.

There is a related additional method for producing monolithic cylinder shaped ceramic parts by deposition of chemical vapor consisting of the steps of: utilizing tooling including at least two rotable shafts and at least one cylindrical substrate, each shaft having at least one circumfrential groove; supporting the two shafts in a horizontal, parallel relationship with their grooves aligned; loosely mounting the cylindrical substrate on the shafts within the grooves on the shafts so as to provide tangential points of support within the respective grooves; installing the shafts within a chemical vapor deposition furnace configured for a direction of flow of chemical vapor lengthwise of the cylindrical substrate; conducting a chemical vapor deposition cycle; rotating the shafts during the deposition cycle so as to cause rolling of the points of support of the substrate; and removing the substrate from the shafts after the deposition cycle.

As will be realized, the invention is capable of other and different embodiments, and its several details are capable of modifications in various obvious respects, all without departing from the essence of the invention.

We claim:

1. A method for producing monolithic disk shaped ceramic parts by deposition of chemical vapor comprising the steps of:

utilizing tooling comprising at least one shaft and at least one disk-shaped substrate with its center larger than the diameter of said shaft, said shaft having at least one circumfrential groove, loosely mounting through its said center each said substrate in a respective said groove on said shaft so as to provide a tangential point of support within said groove when said shaft is held horizontal, installing said shaft horizontally within a chemical vapor deposition furnace configured for a vertical direction of flow of said chemical vapor, conducting a said chemical vapor deposition cycle, rotating said shaft during said deposition cycle so as to cause a rolling point of support of each said substrate, and removing said substrate from said shaft after said deposition cycle.

2. A method for producing monolithic disk shaped ceramic parts according to claim 1, said at least one substrate being a multiplicity of substrates, said groove being a multiplicity of spaced apart grooves.

3. A method for producing monolithic disk shaped ceramic parts according to claim 2, said at least one shaft being a plurality of said shafts, said substrates being distributed among said shafts.

4. A method for producing monolithic disk shaped ceramic parts according to claim 3, said plurality of shafts being oriented in parallel when installed in said furnace chamber.

5. A method for producing monolithic disk shaped ceramic parts according to claim 1, said installing said shaft further comprising installing within an enclosure, said enclosure being adaptable for installing in said furnace and further adaptable for flowing said chemical vapor in a pre-determined direction of flow through said enclosure during said deposition.

6. A method for producing monolithic cylinder shaped ceramic parts by deposition of chemical vapor comprising the steps of:

utilizing tooling comprising at least one shaft and at least one cylindrical substrate with its inner diameter larger than the diameter of said shaft, said shaft having at least one circumfrential groove, loosely mounting through its said inner diameter each said cylindrical substrate in a respective said groove on said shaft so as to provide a tangential point of support within said groove when said shaft is held horizontal, installing said shaft horizontally within a chemical vapor deposition furnace configured for a vertical direction of flow of said chemical vapor, conducting a said chemical vapor deposition cycle, rotating said shaft during said deposition cycle so as to cause a rolling point of support of each said substrate, and removing said substrate from said shaft after said deposition cycle.

7. A method for producing monolithic cylinder shaped ceramic parts according to claim 6, said at least one substrate being a multiplicity of substrates, said groove being a multiplicity of spaced apart grooves.

8. A method for producing monolithic cylinder shaped ceramic parts according to claim 7, said at least one shaft being a plurality of said shafts, said substrates being distributed among said shafts.

9. A method for producing monolithic cylinder shaped ceramic parts according to claim 6, said installing said shaft further comprising installing within an enclosure, said enclosure being adaptable for installing in said furnace and further adaptable for flowing said chemical vapor in a vertical direction of flow through said enclosure during said deposition.

10. A method for producing monolithic spherical shaped ceramic parts by deposition of chemical vapor comprising the steps of:

utilizing tooling comprising at least three rotable support knobs and at least one spherical substrate, orienting said knobs in a triangular pattern in a horizontal plane, loosely mounting said substrate on said knobs, installing said knobs within a chemical vapor deposition furnace, conducting a said chemical vapor deposition cycle, rotating said knobs during said deposition cycle so as to cause rolling said points of support of said substrate, and removing said substrate from said furnace after said deposition cycle.

11. A method for producing monolithic cylindrical shaped ceramic parts by deposition of chemical vapor comprising the steps of;

orienting a cylindrical shaped substrate to have a horizontal axis within a chemical deposition furnace, vertically supporting said cylindrical shaped substrate edgewise in grooves on each of two horizontal, parallel, rotable shafts, rotating said shafts in a common direction while conducting a chemical vapor deposition process in said furnace.

12. A method for producing monolithic disk shaped ceramic parts by deposition of chemical vapor comprising the steps of;

orienting disk-shaped substrates in a spaced apart parallel pattern with a common horizontal axis within a chemical deposition furnace, vertically supporting said substrates edgewise in grooves on each of two horizontal, parallel, rotable shafts, laterally supporting said substrates edgewise in grooves on a third horizontal, parallel, rotable shaft, rotating said shafts in a common direction while conducting a chemical vapor deposition process in said furnace.

* * * * *